US006984553B2

(12) United States Patent
Jeng

(10) Patent No.: US 6,984,553 B2
(45) Date of Patent: Jan. 10, 2006

(54) METHOD FOR FORMING SHALLOW TRENCH ISOLATION WITH CONTROL OF BIRD BEAK

(75) Inventor: Pei-Ren Jeng, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 124 days.

(21) Appl. No.: 10/385,483

(22) Filed: Mar. 12, 2003

(65) Prior Publication Data

US 2004/0180550 A1 Sep. 16, 2004

(51) Int. Cl.
*H01L 21/8238* (2006.01)
*H01L 21/331* (2006.01)
*H01L 21/76* (2006.01)

(52) U.S. Cl. ...................... 438/221; 438/359; 438/424; 438/427

(58) Field of Classification Search ................ 438/221, 438/359, 424, 427
See application file for complete search history.

(56) References Cited

U.S. PATENT DOCUMENTS 4,775,644 A 10/1988 Szeto ......................... 438/439
5,393,693 A 2/1995 Ko et al. ..................... 438/297
5,510,290 A 4/1996 Kwon ......................... 438/439
5,904,540 A * 5/1999 Sheng et al. ................ 438/427
6,020,230 A * 2/2000 Wu ............................ 438/222
6,040,234 A 3/2000 Hisamune ................... 438/439
6,133,114 A * 10/2000 Lu et al. ..................... 438/424
6,136,651 A 10/2000 Chen et al. ................. 438/257
6,150,212 A * 11/2000 Divakaruni et al. ........ 438/244
6,207,532 B1 * 3/2001 Lin et al. .................... 438/424
6,555,442 B1 * 4/2003 Pai et al. .................... 438/424

FOREIGN PATENT DOCUMENTS

EP 0 293 979 A2 12/1988

OTHER PUBLICATIONS

Stanley Wolf Ph.D. and Richard N. Tauber Ph.D. in Silicon Processing for the VLSI Era, vol. 1: Process Technology, Lattice Press, 1986, pp. 195, 539-42.*

* cited by examiner

*Primary Examiner*—William M. Brewster
(74) *Attorney, Agent, or Firm*—Akin Gump Strauss Hauer & Feld, LLP

(57) ABSTRACT

In a manufacturing method for a shallow trench isolation, first, a multi-layer structure is formed over a semiconductor substrate. A first trench is formed in the multi-layer structure to define an isolation region and an active region. Sidewalls in the first trench are formed by depositing sidewall material over the multi-layer structure and surfaces of the first trench and etching the sidewall material. An isolation trench is then formed in the substrate by etching the substrate using the sidewalls and the multi-layer structure as a mask. Then the sidewalls are etched back to expose a portion of the substrate surface. Thermal oxidation is performed to oxidize the second trench, wherein the etched sidewalls and the multi-layer structure protect the substrate underneath from being oxidized. Then, the oxidized second trench is filled with a filling material and the whole structure is polished. The amount by which the sidewalls are etched back controls a bird beak that is formed in the active region.

19 Claims, 4 Drawing Sheets

METHOD FOR FORMING SHALLOW TRENCH ISOLATION WITH CONTROL OF BIRD BEAK

DESCRIPTION OF THE INVENTION

1. Field of the Invention

This invention relates to a method of forming an isolation structure for integrated circuits and more particularly to a method of forming a shallow trench isolation.

2. Background of the Invention

Modern integrated circuits have up to millions of individual devices formed on a single substrate and a density of the devices is still growing. Usually these individual devices must be isolated electrically from each other. Local oxidation of silicon (LOCOS) and shallow trench isolation are examples of isolation techniques.

In forming a typical LOCOS isolation, an oxide layer is selectively grown in the substrate to form a field isolation region using a nitride mask. The nitride mask prevents oxidation on active regions. Problems of the LOCOS technique include the lateral oxidation of silicon adjacent to the isolation regions, which reduces the available substrate area for active devices, and its non-planar topography.

The shallow trench isolation technique is receiving a great deal of attention recently. It is generally considered advantageous over LOCOS in that it requires less substrate area and therefore allows a higher density integration of devices, and it also typically produces planar topographies.

FIGS. 1 and 2 briefly show a processing method for practicing a conventional shallow trench isolation technique. As shown in FIG. 1, a silicon substrate 102 has formed thereon a pad layer 104 and a resistant layer 106. Pad layer 104 can comprise silicon oxide and resistant layer 106 can comprise silicon nitride. Pad layer 104 and resistant layer 106 are patterned to expose a part of substrate 102 to be oxidized and protect active regions. In FIG. 2, using the patterned pad layer 104 and resistant layer 106 as a mask, a trench, whose boundary is indicated by broken lines 108, is formed by etching in the substrate. Thermal oxidation is then performed to grow oxide 110 in the trench. Subsequent steps (not shown) include filling insulating material into the trench and chemical mechanical polishing to planarize the structure.

During the thermal oxidation of the trench, a bird beak 112 is formed around top corners of trench 108 due to an oxidation of the sidewalls of the pad and resistant layers. A subsequent tunnel oxide layer to be formed on bird beak 112 is likely to be thinner than other areas, which causes early breakdown of the device.

SUMMARY OF THE INVENTION

In accordance with the present invention, there is provided a semiconductor manufacturing method that includes providing a substrate, forming a first layer over the substrate, forming a second layer over the first layer, etching the second layer and the first layer to form a first trench, depositing a third layer over a surface of the etched second layer and in the first trench, etching the third layer to form at least one sidewall in the first trench, wherein the sidewall is contiguous to the first layer and the second layer, etching the substrate using the at least one sidewall as a mask to form a second trench in the substrate, etching the at least one sidewall to expose a portion of a surface of the substrate, and oxidizing the second trench, wherein the first layer protects the substrate underneath the first layer from being oxidized.

Also in accordance with the present invention, there is provided a semiconductor manufacturing method that includes providing a silicon substrate, forming a silicon oxynitride layer over the substrate, forming a first layer over the silicon oxynitride layer, etching the first layer and the silicon oxynitride layer to form a first trench, exposing at least part of the substrate at a bottom of the first trench, depositing a second layer over the etched first layer, in the first trench and over the exposed part of the substrate, etching the second layer to form at least one sidewall in the first trench, etching the substrate to form a second trench using the at least one sidewall as a mask, removing at least a portion of the at least one sidewall to expose a portion of a surface of the substrate, filling the second trench with an insulating material, and performing a step of chemical-mechanical polishing to planarize the insulating layer.

Further in accordance with the present invention, there is provided a method of forming a shallow trench isolation that includes providing a substrate, forming a layer of silicon oxynitride over the substrate, forming a first layer over the silicon oxynitride layer, forming a first trench in the silicon oxynitride layer and the first layer, forming at least one oxide sidewall in the first trench, etching the substrate to form a second trench using the at least one oxide sidewall as a mask, wherein the second trench has a first opening size, etching the at least one oxide sidewall to expose a portion of a surface of the substrate, oxidizing of the second trench, wherein the oxidized second trench has a second opening size smaller than the first opening size, and filling the oxidized second trench with a filling material.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention.

In the drawings.

DESCRIPTION OF THE EMBODIMENTS

Reference will now be made in detail to embodiments of the invention, examples of which are illustrated in the accompanying drawings. Wherever possible, the same reference numbers will be used throughout the drawings to refer to the same or like parts.

FIGS. 3–10 show a process of manufacturing a shallow trench isolation consistent with the present invention.

Figure 3:
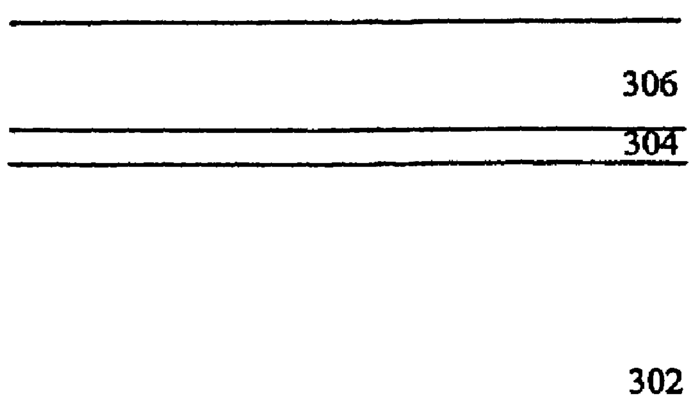
FIGS. 3–10 are cross-sectional views of the shallow trench isolation fabricated by a process consistent with the present invention.

Referring to FIG. 3, there is provided a semiconductor substrate 302 and formed thereon a multi-layer structure comprising a first layer 304 and a second layer 306. Semiconductor substrate 302 can comprise, for example, silicon; first layer 304 can comprise, for example, silicon oxynitride; and second layer 306 can comprise, for example, silicon nitride or silicon carbide.

Figure 4:
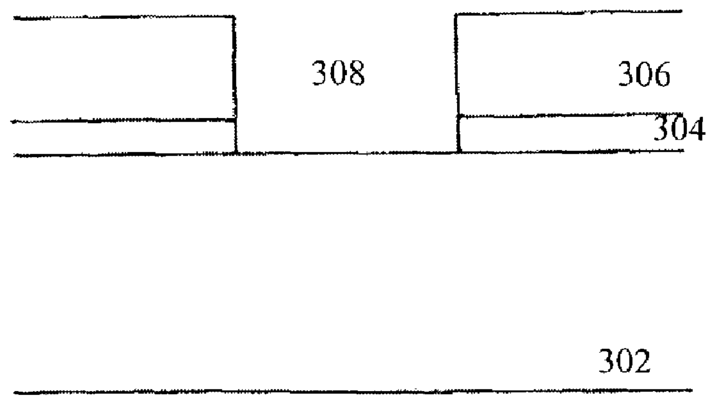

The multi-layer structure is then patterned to form a first trench 308, as shown in FIG. 4. Both first layer 304 and second layer 306 are etched to expose at least a portion of a surface of the substrate. A portion of substrate 302 at the bottom of first trench 308 will become an isolation region and a portion of substrate 302 under the un-etched part of the multi-layer structure will become an active region for devices. First trench 308 has a bottom, which is the exposed portion of the substrate surface, and one or more vertical sidewalls.

Figure 5:
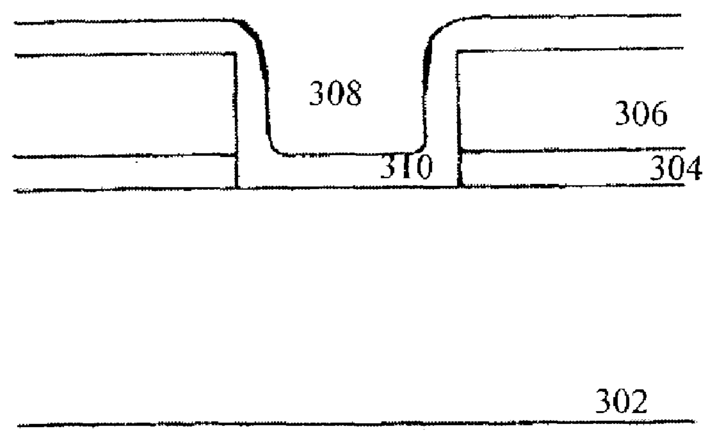

Following the formation of first trench 308, as shown in FIG. 5, a third layer 310, which can comprise an oxide, is formed over an entire surface of the etched first layer 304 and second layer 306 and the one or more vertical sidewalls and the bottom of first trench 308.

Figure 6:
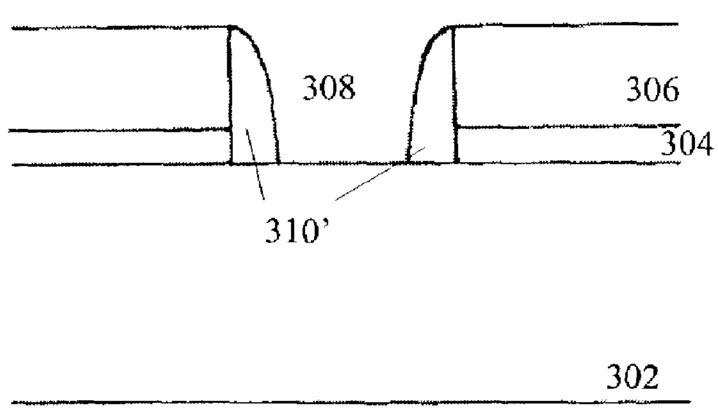
Figure 7:
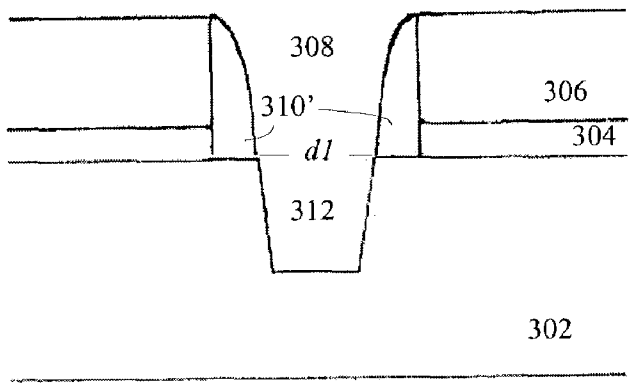

Referring to FIG. 6, third layer 310 is etched to form one or more sidewalls 310' on the sidewalls of first trench 308 and to expose at least a portion of the substrate surface. FIG. 7 shows the result of a further step of etching in the substrate that forms a second trench 312 inside the substrate. Sidewalls 310' together with the patterned first layer 304 and second layer 306 are used as a mask for the etching. As is shown in the figure, a first opening size d1 of second trench 312 is determined by a distance between sidewalls 310' at the bottom of first trench 308.

Figure 8:
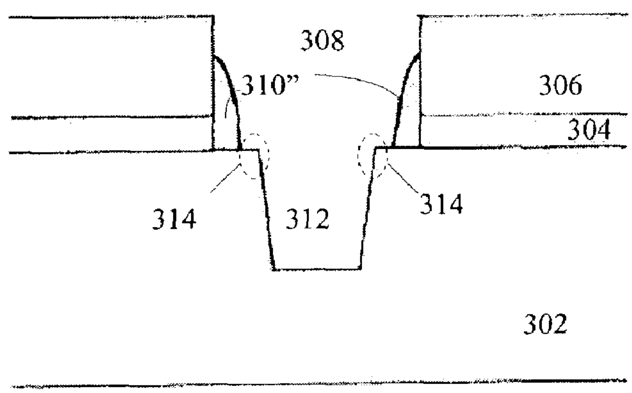

With reference to FIG. 8, sidewalls 310' are etched to expose a portion of surface area of top corners 314 of second trench 312, leaving sidewalls 310". An amount of sidewalls 310' being etched is controlled so that a subsequent oxidation step will form a bird beak of a pre-determined size and shape.

In one aspect, sidewalls 310' are partially removed.

In another aspect, sidewalls 310' are completely removed.

The etching of sidewalls 310' can be performed, for example, by isotropic dry etching, or by dipping the structure in a wet etchant.

Figure 9:
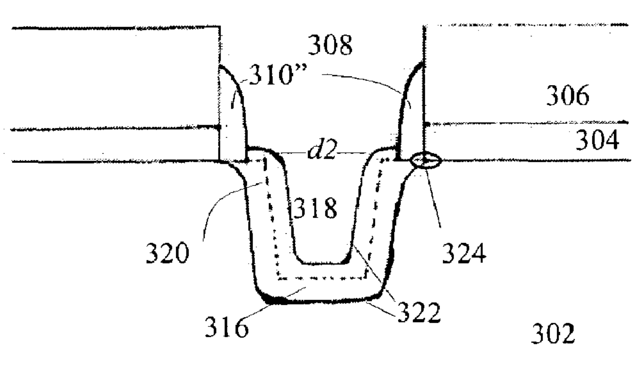

In FIG. 9, a step of oxidation is performed to oxidize second trench 312, forming an oxide layer 316 and a third trench 318. Third trench 318 has a second opening size d2 smaller than first opening size d1. During this oxidation step, sidewalls 310", first layer 304 and second layer 306 protect the surface of substrate 302 underneath sidewalls 310" and first layer 304 from being oxidized. Broken lines 320 indicate a surface of second trench 312 prior to the oxidation step and solid lines 322 indicate a boundary of oxide layer 316. As indicated by broken lines 320 and solid lines 322, oxide 316 is grown both on top of the surface (about 45%) and beneath the surface (about 55%) of second trench 312.

Figure 1:
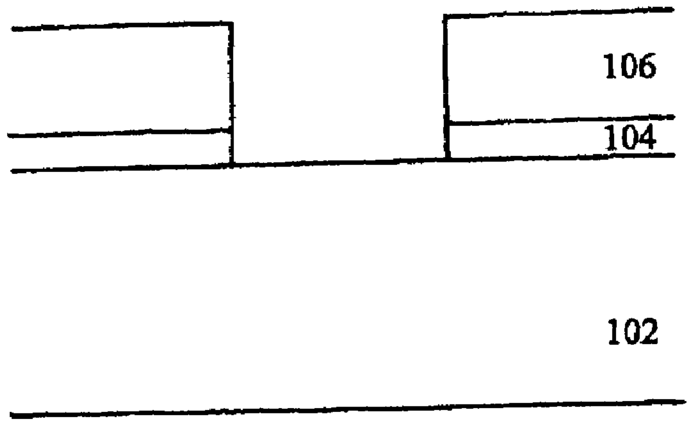
FIGS. 1–2 show a manufacturing process for a conventional shallow trench isolation technique.
Figure 2:
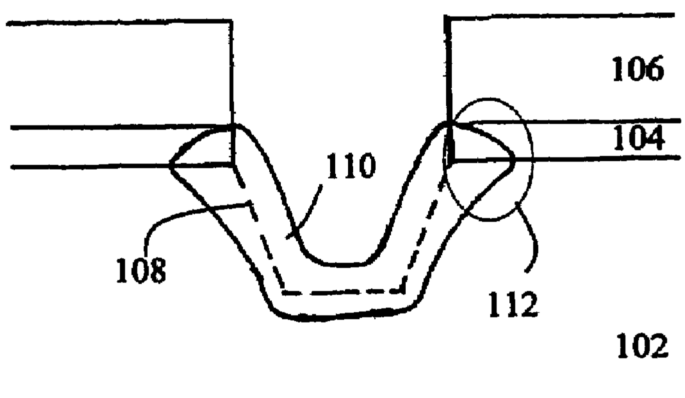

As shown in FIG. 9, due to the protection of sidewalls 310", first layer 304 and second layer 306, a bird beak 324, i.e., the oxidation into the active region of substrate 302 near an interface between substrate 302 and first layer 304, is substantially smaller and shallower than bird beak 112 shown in FIG. 2. Similarly, oxidation on the surface of substrate 302 underneath sidewalls 310" and first layer 304 is minimized. Therefore, after a subsequent step of polishing, the surface of the substrate around the edges of the isolation and active regions will be substantially planar, thereby preventing the thinning phenomenon of a tunnel oxide layer to be formed thereon and the consequent early breakdown problem.

It is understood that the formation of bird beak 324 in the active region can be adjusted by controlling the etching of sidewalls 310' to form sidewalls 310". When the sidewalls 310' are completely removed, a size of bird beak 324 reaches its maximum and when the amount of sidewalls 310' being etched is smaller, the size of bird beak 324 is smaller.

Figure 10:
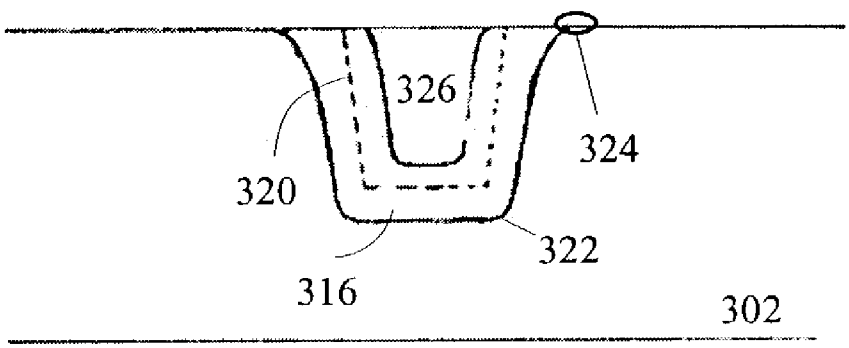

FIG. 10 shows the resulting structure after subsequent steps of filling the oxidized second trench with a filling material 326 and a chemical-mechanical polishing procedure to planarize the surface.

In one aspect, the filling material is filled into the oxidized second trench through a high-density plasma-enhanced chemical vapor deposition (PECVD) process.

It will be apparent to those skilled in the art that various modifications and variations can be made in the disclosed process without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor manufacturing method, comprising:
providing a substrate;
forming a first layer over the substrate wherein the first layer comprises silicon oxynitride;
forming a second layer over the first layer;
etching the second layer and the first layer to form a first trench;
depositing a third layer over a surface of the etched second layer and in the first trench;
etching the third layer to form at least one sidewall in the first trench, wherein the sidewall is contiguous to the first layer and the second layer;
etching the substrate using the at least one sidewall as a mask to form a second trench in the substrate;
etching the at least one sidewall to expose a portion of a surface of the substrate; and
oxidizing the second trench, wherein the first layer protects the substrate underneath the first layer from being oxidized.

2. The method as claimed in claim 1, wherein the substrate comprises silicon.

3. The method as claimed in claim 1, wherein the second layer comprises silicon nitride.

4. The method as claimed in claim 1, wherein the third layer comprises an oxide.

5. The method as claimed in claim 1, wherein etching the at least one sidewall partially removes the at least one sidewall.

6. The method as claimed in claim 1, wherein etching the at least one sidewall completely removes the at least one sidewall.

7. A semiconductor manufacturing method, comprising:
providing a silicon substrate;
forming a silicon oxynitride layer over the substrate;
forming a first layer over the silicon oxynitride layer;
etching the first layer and the silicon oxynitride layer to form a first trench, exposing at least part of the substrate at a bottom of the first trench;
depositing a second layer over the etched first layer, in the first trench and over the exposed part of the substrate;
etching the second layer to form at least one sidewall in the first trench;
etching the substrate to form a second trench using the at least one sidewall as a mask;
removing at least a portion of the at least one sidewall to expose a portion of a surface of the substrate;
filling the second trench with an insulating material; and
performing a step of chemical-mechanical polishing to planarize the insulating material.

8. The method as claimed in claim 7, wherein the first layer comprises silicon nitride.

9. The method as claimed in claim 7, wherein filling the second trench with an insulating material comprises oxidizing the second trench.

10. The method as claimed in claim 7, wherein the second layer comprises an oxide.

11. The method as claimed in claim 7, wherein removing at least a portion of the at least one sidewall is performed by dipping the structure in a wet etchant.

12. The method as claimed in claim 7, wherein removing at least a portion of the at least one sidewall is performed by isotropic dry etching.

13. A method of forming a shallow trench isolation, comprising:

providing a substrate;

forming a layer of silicon oxynitride over the substrate;

forming a first layer over the silicon oxynitride layer;

forming a first trench in the silicon oxynitride layer and the first layer;

forming at least one oxide sidewall in the first trench;

etching the substrate to form a second trench using the at least one oxide sidewall as a mask, wherein the second trench has a first opening size;

etching the at least one oxide sidewall to expose a portion of a surface of the substrate;

oxidizing of the second trench, wherein the oxidized second trench has a second opening size smaller than the first opening size; and filling the oxidized second trench with a filling material.

14. The method as claimed in claim 13, further comprising performing a chemical mechanical polishing to produce a planar structure.

15. The method as claimed in claim 13, wherein the first layer comprises silicon nitride.

16. The method as claimed in claim 13, wherein etching the at least one oxide sidewall partially removes the at least one oxide sidewall.

17. The method as claimed in claim 13, wherein etching the at least one oxide sidewall completely removes the at least one oxide sidewall.

18. The method as claimed in claim 13, wherein etching the at least one sidewall is performed by one of isotropic dry etching and dipping the structure in a wet etchant.

19. The method as claimed in claim 13, wherein the filling material is filled into the oxidized second trench using high density plasma enhanced chemical vapor deposition method.

* * * * *